(12) United States Patent
Zheng et al.

(10) Patent No.: US 11,387,785 B2
(45) Date of Patent: Jul. 12, 2022

(54) RADIO FREQUENCY RECEIVER, RADIO FREQUENCY TRANSMITTER, AND COMMUNICATIONS DEVICE

(71) Applicant: Huawei Technologies Co., Ltd., Shenzhen (CN)

(72) Inventors: Yushan Zheng, Shenzhen (CN); Fuquan Zhang, Shanghai (CN); Jinming Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/080,058

(22) Filed: Oct. 26, 2020

(65) Prior Publication Data

US 2021/0044259 A1 Feb. 11, 2021

Related U.S. Application Data

(63) Continuation of application No. PCT/CN2018/085188, filed on Apr. 28, 2018.

(51) Int. Cl.
*H03F 1/32* (2006.01)
*H03F 3/213* (2006.01)
*H04B 1/04* (2006.01)

(52) U.S. Cl.
CPC .......... *H03F 1/3276* (2013.01); *H03F 3/213* (2013.01); *H04B 1/04* (2013.01);
(Continued)

(58) Field of Classification Search
CPC .. H03F 1/3276; H03F 3/213; H03F 2200/336; H03F 2200/451; H04B 1/04; H04B 2001/0416
(Continued)

(56) References Cited

U.S. PATENT DOCUMENTS

2005/0068102 A1 3/2005 Hongo et al.
2005/0258898 A1 11/2005 Hongo
(Continued)

FOREIGN PATENT DOCUMENTS

CN 1700591 A 11/2005
CN 101316124 A 12/2008
(Continued)

OTHER PUBLICATIONS

Lee, S., et al., "Digital Predistortion for Power Amplifiers in Hybrid MIMO Systems with Antenna Subarrays," 2015 IEEE 81 ST Vehicular Technology Conference (VTC Spring), IEEE, May 11, 2015, 5 pages.

*Primary Examiner* — Kevin M Burd
(74) *Attorney, Agent, or Firm* — Conley Rose, P.C.

(57) ABSTRACT

A radio frequency transmitter includes N transmit channels, where each transmit channel includes one nonlinear module, a primary correction circuit, coupled to each of N nonlinear modules that correspond to the N transmit channels, and configured to provide a primary correction signal for the N nonlinear modules, and N secondary correction circuits, where the N secondary correction circuits are coupled to the N nonlinear modules respectively, and each secondary correction circuit is configured to provide a secondary correction signal for a nonlinear module coupled to the secondary correction circuit.

19 Claims, 7 Drawing Sheets

(52) U.S. Cl.
CPC .. *H03F 2200/336* (2013.01); *H03F 2200/451* (2013.01); *H04B 2001/0416* (2013.01)

(58) Field of Classification Search
USPC ........................................... 375/297
See application file for complete search history.

(56) References Cited

U.S. PATENT DOCUMENTS

| | | | |
|---|---|---|---|
| 2012/0155572 A1* | 6/2012 | Kim | H03F 3/24 |
| | | | 375/297 |
| 2013/0195221 A1 | 8/2013 | Lozhkin | |
| 2015/0103952 A1 | 4/2015 | Wang et al. | |
| 2015/0162882 A1* | 6/2015 | Tam | H03F 1/0216 |
| | | | 330/291 |
| 2015/0372745 A1* | 12/2015 | Abe | H04B 1/1027 |
| | | | 375/232 |
| 2017/0163217 A1 | 6/2017 | Bonebright et al. | |
| 2017/0201368 A1* | 7/2017 | Hou | H04B 1/48 |
| 2018/0026586 A1 | 1/2018 | Carbone et al. | |
| 2018/0191314 A1* | 7/2018 | Pratt | H03F 1/0233 |
| 2019/0393842 A1* | 12/2019 | Mochida | H03F 1/3258 |

FOREIGN PATENT DOCUMENTS

| | | |
|---|---|---|
| CN | 102594749 A | 7/2012 |
| EP | 2204903 A1 | 7/2010 |
| WO | 2017091119 A1 | 6/2017 |

\* cited by examiner

RADIO FREQUENCY RECEIVER, RADIO FREQUENCY TRANSMITTER, AND COMMUNICATIONS DEVICE

CROSS-REFERENCE TO RELATED APPLICATIONS

This application is a continuation of International Patent Application No. PCT/CN2018/085188, filed on Apr. 28, 2018, the disclosure of which is hereby incorporated by reference in its entirety.

TECHNICAL FIELD

Embodiments of this application relate to the field of circuit technologies, and in particular, to a radio frequency receiver, a radio frequency transmitter, and a communications device.

BACKGROUND

A communications device (for example, a base station) may radiate a radio frequency signal with a relatively high frequency into an electromagnetic wave through an antenna, and further perform wireless communication with another communications device using the electromagnetic wave as a medium. For example, the base station generally includes a baseband circuit and a radio frequency transceiver. Further, the radio frequency transceiver may include a radio frequency transmitter and a radio frequency receiver. In a process in which the base station transmits a signal, the baseband circuit is configured to transmit a baseband signal that has not been modulated, and the radio frequency transceiver is configured to modulate the baseband signal into a radio frequency signal with a relatively high frequency and relatively high power, and then send the radio frequency signal to another communications device through an antenna. A process in which the base station receives a signal is opposite to the process in which the base station transmits a signal, and details are not described herein again.

With development of multiple-input multiple-output (MIMO) technologies, structures of the radio frequency transmitter and the radio frequency receiver become more complex, and an occupied area and power consumption of the radio frequency transmitter and the radio frequency receiver increase greatly.

FIG. 1 is a schematic structural diagram of a multi-channel radio frequency transmitter in other approaches. On each transmit channel, a radio frequency signal output by a modulation and demodulation circuit 10 is input to an amplification circuit 20. The amplification circuit 20 inputs an amplified radio frequency signal to an antenna 30, and transmits, through the antenna 30, the amplified radio frequency signal to another device for communication. In addition, each transmit channel in the radio frequency transmitter further includes a correction circuit 40 configured to correct nonlinear distortion caused by the amplification circuit 20, to improve even or odd linearity of the radio frequency transmitter. Correction circuits 40 of all transmit channels are independent of each other.

With development of communications technologies, a communications device supports more frequency bands, technologies including a carrier aggregation technology and a beamforming technology are widely applied. As a result, a quantity of channels in the radio frequency transmitter is growing, and a quantity of correction circuits 40 in the radio frequency transmitter also increases proportionally. This causes an increase in power consumption during correction of nonlinear distortion. Therefore, a new nonlinear correction solution is urgently required to reduce power consumption.

SUMMARY

According to a radio frequency receiver, a radio frequency transmitter, and a communications device provided in embodiments of this application, an architecture in which one primary correction circuit is combined with N discrete secondary correction circuits is introduced such that a plurality of channels can share the primary correction circuit to correct nonlinear distortion in the radio frequency receiver or the radio frequency transmitter, to reduce power consumption for correction.

To achieve the foregoing objective, the following technical solutions are used in the embodiments of this application.

According to a first aspect, an embodiment of this application provides a radio frequency transmitter, including N (N is a positive integer greater than 1) transmit channels, where each transmit channel includes one nonlinear module, a primary correction circuit, coupled to each of N nonlinear modules that correspond to the N transmit channels, and configured to provide a primary correction signal for the N nonlinear modules, and N secondary correction circuits, where the N secondary correction circuits are coupled to the N nonlinear modules respectively, and each secondary correction circuit is configured to provide a secondary correction signal for a nonlinear module coupled to the secondary correction circuit. The primary correction signal and a secondary correction signal that is provided by a first secondary correction circuit (namely, any one of the N secondary correction circuits) may be used to correct nonlinear distortion in a first nonlinear module (namely, a nonlinear module coupled to the first secondary correction circuit). In other words, nonlinear distortion generated by each nonlinear module may be corrected using the primary correction signal and a secondary correction signal that corresponds to the nonlinear module.

To be specific, in other approaches, nonlinear distortion in each nonlinear module may be divided into two parts nonlinear distortion (A) and nonlinear distortion (B). Correspondingly, each correction circuit 40 shown in FIG. 1 needs to include operation logic required for correcting the two types of nonlinear distortion. However, in this application, an architecture in which one primary correction circuit is combined with N discrete secondary correction circuits is introduced. In this way, nonlinear distortion generated on each channel can be corrected using a correction signal generated after the primary correction circuit and a corresponding secondary correction circuit are combined. The nonlinear distortion (A) in each nonlinear module is corrected using the primary correction signal provided by the primary correction circuit, and the nonlinear distortion (B) in the nonlinear module is corrected using a secondary correction signal provided by a secondary correction circuit corresponding to the nonlinear module. Therefore, there is no need to dispose, on each channel, a correction circuit that can completely correct nonlinear distortion in a nonlinear module on the channel. In conclusion, the primary correction circuit is reused to correct the nonlinear distortion (A), and the N secondary correction circuits are used to correct the nonlinear distortion (B) in each nonlinear module. Compared with the correction circuit 40 in FIG. 1, this structure has simpler overall operation logic used for nonlinear correction, and correspondingly implements lower power consumption. In this way, power consumption for correction is reduced while correction precision comparable to that in other approaches is ensured.

In a possible design, each nonlinear module includes a nonlinear device and a power supply module. The power supply module is configured to adjust, based on correction signals, a power supply to the nonlinear module corresponding to the power supply module, where the correction signals include the primary correction signal and the secondary correction signal that is provided for the power supply module.

In a possible design, the primary correction circuit is configured to obtain a first feedback signal from a signal output by each of the N nonlinear modules, generate a predistortion signal based on N obtained first feedback signals, and input the predistortion signal (namely, the primary correction signal) to a power supply module corresponding to each of the N nonlinear modules. In this way, a distortion signal actually generated on each transmit channel may be partially or completely cancelled by the predistortion signal subsequently, to obtain an output signal with higher linearity.

In a possible design, each of the N secondary correction circuits is configured to obtain a second feedback signal from a signal output by a nonlinear module corresponding to the secondary correction circuit, obtain, based on the second feedback signal, a power supply control signal that is of the nonlinear module and that exists when linearity is less than or equal to a preset threshold, and input the power supply control signal (namely, the secondary correction signal) to a power supply module corresponding to the nonlinear module.

In a possible design, the primary correction signal is used to correct first nonlinear distortion that commonly exists in the N nonlinear modules, the secondary correction signal provided by each secondary correction circuit is used to correct second nonlinear distortion that exists in the corresponding nonlinear module, and respective second nonlinear distortion in the N nonlinear modules differs.

In this application, nonlinear distortion in each nonlinear module is divided into a common part and a differentiated part. The common part is referred to as the first nonlinear distortion, and the differentiated part is referred to as the nonlinear distortion. In other approaches shown in FIG. 1, the correction circuit 40 corresponding to each transmit channel needs to correct the two types of nonlinear distortion. Therefore, a design of the correction circuit is relatively complex, power consumption is relatively high, and an occupied area is relatively large. However, in the radio frequency receiver provided in the first aspect of this application, on all transmit channels, the first nonlinear distortion generated by the nonlinear module may be corrected using one primary correction circuit. Compared with other approaches in which each correction circuit 40 needs to include the operation logic for correcting the first nonlinear distortion, the solution in this application can greatly reduce correction resources, such as power consumed by the correction circuit and an area occupied by the correction circuit, for an entire radio frequency transceiver. In addition, each secondary correction circuit may further correct nonlinear distortion generated by the nonlinear module corresponding to the secondary correction circuit such that accuracy of nonlinear distortion correction can be ensured while correction resource consumption is reduced.

In a possible design, the first nonlinear distortion is caused by a common first distortion factor, and the second nonlinear distortion is caused by a differentiated second distortion factor. In other words, for the first nonlinear distortion, that commonly exist on the N transmit channels, caused by the first distortion factor, the primary correction circuit may be used for correction on each transmit channel. In this way, there is no need to dispose a primary correction circuit on each transmit channel, thereby greatly reducing resources, such as an occupied area and consumed power, for correction of the entire radio frequency transmitter. For the second nonlinear distortion, that exists on the N transmit channels, caused by the differentiated second distortion factor, the secondary correction circuit may be used for correction on the corresponding transmit channel. In this way, correction precision and accuracy of the entire radio frequency transmitter can be improved.

In a possible design, each of the N secondary correction circuits includes a feedback circuit and a dummy circuit. The dummy circuit is configured to reproduce a nonlinear feature of a corresponding nonlinear module. An input end of the dummy circuit is coupled to an input end of the nonlinear module, an output end of the dummy circuit is coupled to an input end of the feedback circuit, and an output end of the feedback circuit is coupled to an input end of a power supply module in the nonlinear module. The feedback circuit is configured to obtain a bias voltage or a bias current that is of the dummy circuit and that exists when the linearity is less than or equal to the preset threshold, where the bias voltage or the bias current is the secondary correction signal.

In this way, a radio frequency signal input to the nonlinear module is also input to the dummy circuit. Therefore, the nonlinear feature of the nonlinear module also appears in the dummy circuit. Then, the dummy circuit may input an output signal with nonlinear distortion as the second feedback signal to the feedback circuit. The feedback circuit continuously updates the bias voltage or the bias current of the dummy circuit, until linearity between the output signal and the input signal of the dummy circuit is relatively good. In this case, the feedback circuit may input the bias voltage or the bias current at this time as the secondary correction signal to the power supply module in the nonlinear module such that the nonlinear device in the nonlinear module can work at the bias voltage or the bias current, and the linearity between the output signal and the input signal of the nonlinear module reaches an optimized state with relatively small nonlinear distortion.

In addition, because the feedback circuit only needs to input a finally obtained power supply control signal to the nonlinear module at a time, a working state of the nonlinear module is not affected in an entire process of performing nonlinear correction by the feedback circuit and the dummy circuit. This can reduce impact of the correction process on a main channel signal.

In a possible design, the secondary correction circuit may generate the secondary correction signal in an analog predistortion (APD) manner, and the primary correction circuit may generate the primary correction signal in an APD correction circuit manner or a digital predistortion (DPD) manner.

In a possible design, the primary correction circuit is configured to be independently enabled or disabled, and the secondary correction circuit is configured to be independently enabled or disabled.

In a possible design, the radio frequency transmitter is configured to perform beamforming or carrier aggregation.

For example, the nonlinear device in the nonlinear module may be at least one of a power amplifier (PA), a mixer, or a variable gain amplifier (VGA).

According to a second aspect, an embodiment of this application provides a radio frequency receiver, including N (N is a positive integer greater than 1) receive channels, where each receive channel includes one nonlinear module, a primary correction circuit, coupled to each of N nonlinear modules that correspond to the N receive channels, and configured to provide a primary correction signal for the N nonlinear modules, and N secondary correction circuits, where the N secondary correction circuits are coupled to the N nonlinear modules respectively, and each secondary correction circuit is configured to provide a secondary correction signal for a nonlinear module coupled to the secondary correction circuit. The primary correction signal and a secondary correction signal that is provided by a first secondary correction circuit (namely, any one of the N secondary correction circuits) may be used to correct nonlinear distortion in the first nonlinear module (namely, a nonlinear module coupled to the first secondary correction circuit). In other words, nonlinear distortion generated by each nonlinear module is corrected using the primary correction signal and a secondary correction signal that corresponds to the nonlinear module.

In a possible design, each nonlinear module further includes a nonlinear device and a power supply module. The power supply module is configured to adjust, based on correction signals, a power supply to the nonlinear module corresponding to the power supply module, where the correction signals include the primary correction signal and the secondary correction signal that is provided for the power supply module.

For example, the nonlinear device in the nonlinear module may be at least one of a low noise amplifier, a mixer, or a VGA.

In a possible design, each nonlinear module has an M-bit bias voltage, N bias voltages corresponding to the N receive channels differ, and M is a positive integer greater than 1. The primary correction circuit is configured to correct the first X bits of the N bias voltages, and each of the N secondary correction circuits is configured to correct the last Y bits of a bias voltage of the nonlinear module coupled to the secondary correction circuit. X+Y=M, and both X and Y are positive integers.

In a possible design, each of the N secondary correction circuits is coupled to the nonlinear module on the corresponding receive channel through an adder, and the primary correction circuit is coupled to each of the nonlinear modules on the N receive channels through the adder.

In a possible design, the primary correction circuit is a first digital-to-analog converter (DAC), and each of the N secondary correction circuits is a second DAC.

In a possible design, the primary correction signal is used to correct first nonlinear distortion that commonly exists in the N nonlinear modules, the secondary correction signal provided by each secondary correction circuit is used to correct second nonlinear distortion that exists in the corresponding nonlinear module, and respective second nonlinear distortion in the N nonlinear modules differs.

The first nonlinear distortion is caused by a common first distortion factor, and the second nonlinear distortion is caused by a differentiated second distortion factor.

In a possible design, the radio frequency receiver is configured to perform beamforming or carrier aggregation.

According to a third aspect, an embodiment of this application provides a radio frequency transmitter, including N transmit channels, where each transmit channel includes one nonlinear module, each nonlinear module includes a power supply module and a nonlinear device, and N is a positive integer greater than 1, and N correction circuits, where the N correction circuits are coupled to N nonlinear modules respectively. Each correction circuit includes a feedback circuit and a dummy circuit, where the dummy circuit is configured to reproduce a nonlinear feature of a corresponding nonlinear module. An input end of the dummy circuit is coupled to an input end of the nonlinear module, an output end of the dummy circuit is coupled to an input end of the feedback circuit, and an output end of the feedback circuit is coupled to an input end of a power supply module in the nonlinear module. The feedback circuit is configured to generate a correction signal based on a bias voltage or a bias current of the dummy circuit, to correct nonlinear distortion generated by the nonlinear module.

In a possible design, the feedback circuit is further configured to detect a bias voltage or a bias current that is of the dummy circuit and that exists when linearity is less than or equal to a preset threshold, and correct, using the bias voltage or the bias current, the nonlinear distortion generated by the nonlinear module.

According to a fourth aspect, an embodiment of this application provides a radio frequency transceiver chip, including the radio frequency transmitter and the radio frequency transmitter in any one of the foregoing possible designs.

According to a fifth aspect, an embodiment of this application provides a communications device, including a baseband processor and the radio frequency transmitter in any one of the foregoing possible designs. The radio frequency transmitter is coupled to the baseband processor. The radio frequency transmitter is configured to convert a baseband signal output by the baseband processor into a transmit signal, and output the transmit signal through an antenna.

According to a sixth aspect, an embodiment of this application provides a communications device, including a baseband processor and the radio frequency receiver in any one of the foregoing possible designs. The radio frequency receiver is coupled to the baseband processor. The radio frequency receiver is configured to convert a receive signal received by the antenna into a baseband signal, and input the baseband signal to the baseband processor.

In the embodiments of this application, names of the components in the radio frequency transmitter, the radio frequency receiver, and the radio frequency transceiver constitute no limitation on the circuit. In actual implementation, these components may have other names. Provided that functions of the components are similar to those in the embodiments of this application, the components fall within the scope of the claims of this application and equivalent technologies thereof.

In addition, for technical effects brought by any one of the designs in the second aspect to the sixth aspect, refer to technical effects brought by different designs in the first aspect. Details are not described herein again.

DESCRIPTION OF EMBODIMENTS

Figure 1:
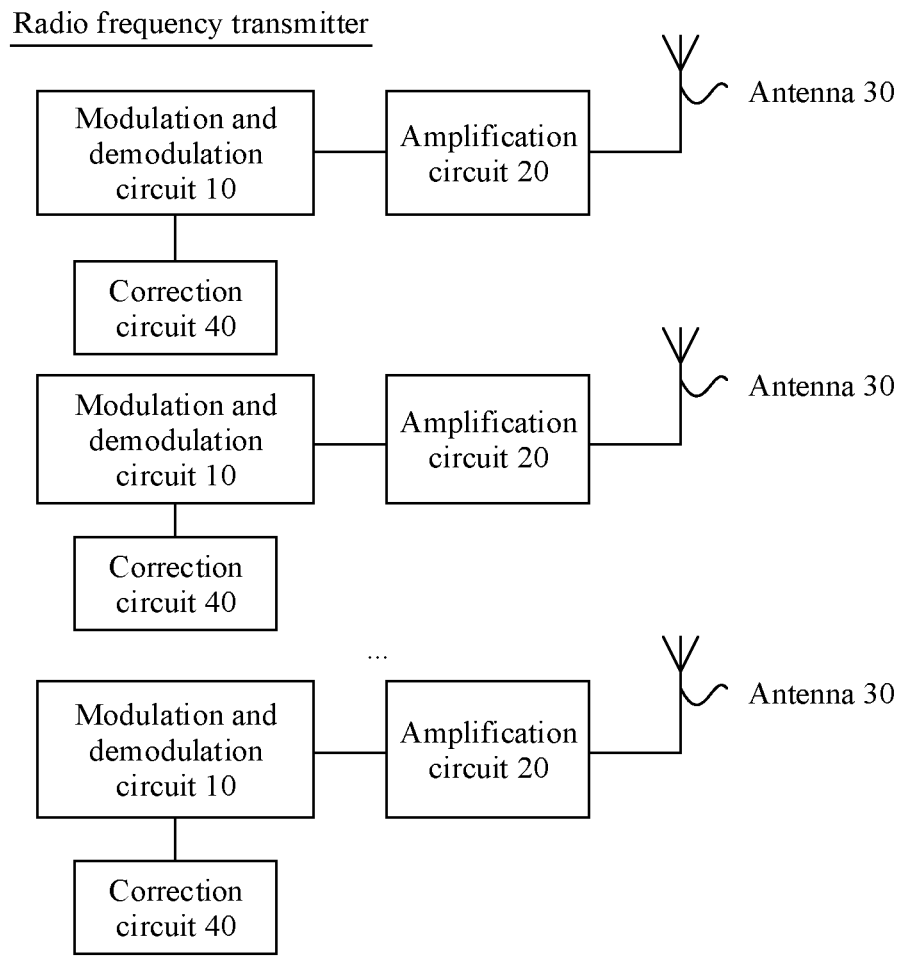
FIG. 1 is a schematic structural diagram of a radio frequency transmitter in other approaches.

The following terms "first" and "second" are merely intended for a purpose of description, and shall not be understood as an indication or implication of relative importance or implicit indication of a quantity of indicated technical features. Therefore, a feature limited by "first" or "second" may explicitly or implicitly include one or more features. In the description of the embodiment of this application, unless otherwise stated, "a plurality" means two or more than two.

Nonlinear distortion may also be referred to as waveform distortion, nonlinear distortion, or the like, and means that an output signal and an input signal of a radio frequency transceiver are not in a linear relationship, and consequently, a new harmonic (harmonic wave) component is generated in the output signal.

For example, in the radio frequency transceiver, the nonlinear distortion may further include even distortion caused by an even harmonic and odd distortion caused by an odd harmonic. A harmonic whose rated frequency is an even multiple of a frequency of a fundamental wave is referred to as the even harmonic. Correspondingly, a harmonic whose rated frequency is an odd multiple of a frequency of a fundamental wave is referred to as the odd harmonic. The even harmonic generally appears in a demodulation circuit of a radio frequency receiver.

To avoid nonlinear distortion in the radio frequency transceiver, usually, a correction circuit may be additionally disposed in a transmitter circuit or a receiver circuit of the radio frequency transceiver, and a module or a device that is prone to generate nonlinear distortion is corrected using a nonlinear predistortion algorithm, a nonlinear compensation algorithm, or the like, to improve linearity of an output signal.

However, for a radio frequency transceiver that integrates a plurality of channels, if a correction circuit is disposed on each channel, resources, such as consumed power, an occupied area, and an interface, for correction of the entire radio frequency transceiver increase proportionally with a quantity of channels. This reduces signal sending and receiving efficiency of the entire radio frequency transceiver.

It should be noted that a channel in the embodiments of this application may be a receive channel, or may be a transmit channel. For example, in a radio frequency transmitter, a channel may be a transmit channel, and may further include a modulation circuit (which may include devices such as a mixer, a DAC, and a filter) used for up-conversion, and a device such as amplifier used for a radio frequency front-end part. In the radio frequency receiver, a channel may be a receive channel, and may further include a device such as a low noise amplifier in the radio frequency front-end part, and a modulation circuit (which may include devices such as a mixer, a DAC, and a filter) used for down-conversion.

An embodiment of this application provides a radio frequency transceiver having a plurality of channels. The radio frequency transceiver may be applied to an application scenario such as a beamforming or carrier aggregation scenario. It should be learned that the radio frequency transceiver usually refers to an apparatus that integrates functions of receiving and transmitting a radio frequency signal. If the receiving function is separated from the transmitting function, corresponding apparatuses are a radio frequency receiver and a radio frequency transmitter respectively. The technical solution provided in this application is not limited to being applied to a radio frequency transceiver, and may also be used in a radio frequency receiver or a radio frequency transmitter. The radio frequency transceiver is only used as an example herein for description, and should not constitute a limitation on an application scope of the solution.

Specifically, factors that cause nonlinear distortion on different channels may be classified into two types a first distortion factor and a second distortion factor.

The first distortion factor is a common factor that causes nonlinear distortion on each channel. Generally, the first distortion factor is a process variation factor that causes nonlinear distortion on each channel in the radio frequency transceiver. The process variation refers to a phenomenon that a deviation occurs in parameters of a transistor and an interconnection line in a semiconductor manufacturing process. The process variation may be further indicated by a process corner. For example, wafers in a same radio frequency transceiver are from a same batch. Therefore, if processes and device performance of these wafers vary in a manufacturing process, subsequent nonlinear distortion caused by this cause should be the same on all channels in the radio frequency transceiver. For another example, electronic devices on all channels in a same radio frequency transceiver are produced and work under a same temperature or humidity condition. Therefore, nonlinear distortion caused by a temperature (or humidity) variation is also the same on all the channels. In this embodiment of this application, distortion factors such as a batch variation or a temperature variation in the foregoing manufacturing process may be referred to as the first distortion factor. The first distortion factor is usually a critical factor that causes nonlinear distortion in the radio frequency transceiver, and nonlinear distortion caused by the first distortion factor may be referred to as first nonlinear distortion.

The second distortion factor is a specific factor that causes nonlinear distortion on each channel. Generally, the second distortion factor, in an embodiment, a temperature gradient difference or a random process mismatch at different locations on each channel in the radio frequency transceiver causes nonlinear distortion. The second distortion factor causes a difference in nonlinear distortion generated at different locations on each channel. In this embodiment of this application, a distortion factor that causes a difference in nonlinear distortion on channels of a same chip may be referred to as the second distortion factor, and nonlinear distortion caused by the second distortion factor may be referred to as second nonlinear distortion.

Therefore, in this embodiment of this application, a correction circuit (referred to as a primary correction circuit in this application) may be disposed in the radio frequency transceiver, to correct first nonlinear distortion generated on each channel, and a secondary correction circuit may be disposed on each channel, to correct second nonlinear distortion generated on the channel.

In other words, in this application, an architecture in which one primary correction circuit is combined with N discrete secondary correction circuits is introduced into the radio frequency transceiver. In this way, nonlinear distortion generated on each channel can be corrected using a correction signal generated after the primary correction circuit and a corresponding secondary correction circuit are combined. First nonlinear distortion in each nonlinear module may be corrected using a primary correction signal provided by the primary correction circuit, and the first nonlinear distortion in the nonlinear module is corrected using a secondary correction signal provided by a secondary correction circuit corresponding to the nonlinear module.

In this way, there is no need to dispose, on each channel, a correction circuit that can completely correct nonlinear distortion in the nonlinear module on the channel. In conclusion, the primary correction circuit is reused to correct the first nonlinear distortion, and the N secondary correction circuits are used to correct the second nonlinear distortion in each nonlinear module. Compared with the correction circuit 40 in FIG. 1, this structure has simpler overall operation logic used for nonlinear correction, and correspondingly implements lower power consumption. In this way, power consumption for correction is reduced while correction precision comparable to that in other approaches is ensured.

Specifically, in this embodiment of this application, one or more devices that are prone to generate nonlinear distortion on each channel in the radio frequency transceiver are referred to as one or more nonlinear modules, namely, one or more to-be-corrected objects. It should be noted that functions of nonlinear modules on each channel may be the same. For example, all the nonlinear modules on each channel are PAs used for power amplification. Certainly, in some implementations, nonlinear modules on different channels may alternatively be different. For example, a nonlinear module that generates nonlinear distortion on a first channel may be a PA, and a nonlinear module that generates nonlinear distortion on a second channel may be a VGA.

The radio frequency transmitter is used as an example. Each transmit channel in the radio frequency transmitter includes devices such as a modulation circuit and an amplification circuit. If nonlinear distortion exists in the modulation circuit, the modulation circuit may be used as a to-be-corrected nonlinear module, and is corrected using a two-level correction architecture including the primary correction circuit and the secondary correction circuit. Correspondingly, if nonlinear distortion exists in the amplification circuit, the amplification circuit may be used as a to-be-corrected nonlinear module, and is corrected using the two-level correction architecture including the primary correction circuit and the secondary correction circuit. Certainly, the modulation circuit and the amplification circuit may be used as a non-linear module as a whole for correction. This is not limited in this embodiment of this application.

Further, the amplification circuit may further include devices such as a VGA, a PA, a mixer, and a filter. In this case, in the two-level correction architecture including the primary correction circuit and the secondary correction circuit, one or more devices in the amplification circuit may be further used as one or more to-be-corrected nonlinear modules, and nonlinear distortion generated by the one or more nonlinear modules is corrected. This is not limited in this embodiment of this application.

In addition, regardless of which device or devices in the radio frequency transceiver are used as the foregoing nonlinear modules, each nonlinear module may further include a nonlinear device and a power supply module. The nonlinear device in the nonlinear module is further configured to implement a signal processing function of the nonlinear module, and the power supply module is further configured to provide a power supply signal, for example, a bias voltage or a bias current for the nonlinear device. For example, when the PA is used as a nonlinear module, a nonlinear device in the PA is configured to amplify a received signal (in this case, the nonlinear device is usually referred to as a PA), and a power supply module in the PA is configured to supply power to the nonlinear device in the PA.

Figure 2:
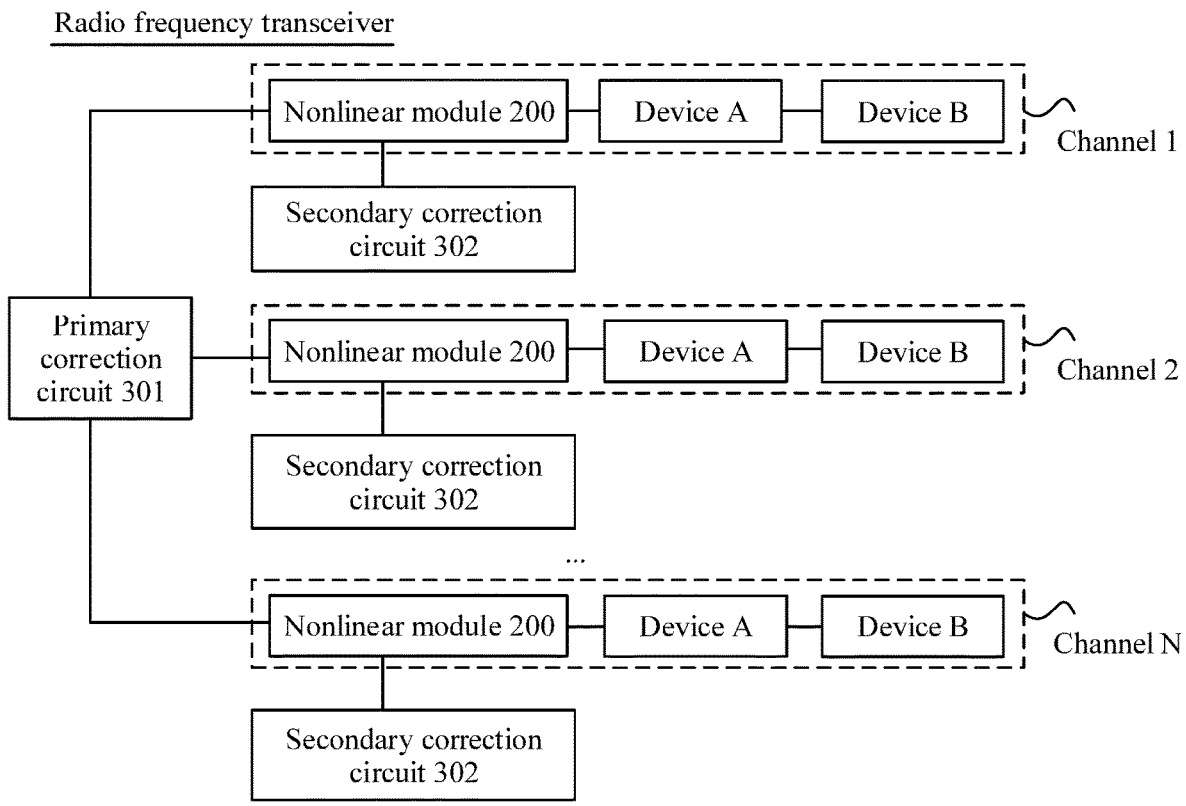
FIG. 2 is a schematic structural diagram of a radio frequency transceiver according to an embodiment of this application.

For example, as shown in FIG. 2, the radio frequency transceiver includes N channels. After the nonlinear module in the radio frequency transceiver is determined, a primary correction circuit 301 may be coupled to each of N nonlinear modules 200 on the N channels, and the primary correction circuit 301 provides a primary correction signal for the N nonlinear modules 200. In addition, each of N secondary correction circuits 302 may be coupled to a nonlinear module 200 on a corresponding channel, to provide a secondary correction signal for the nonlinear module 200 corresponding to the secondary correction circuit 302.

Specifically, the primary correction signal provided by the primary correction circuit 301 is used to correct first nonlinear distortion that commonly exists in the N nonlinear modules 200. The secondary correction signal provided by each secondary correction circuit 302 is used to correct second nonlinear distortion that exists in the corresponding nonlinear module 200.

In such an architecture in which the primary correction circuit 301 and the N secondary correction circuits 302 are combined, on all transmit channels, the first nonlinear distortion generated by the nonlinear module may be corrected using one primary correction circuit. Compared with other approaches in which the correction circuit on each channel needs to include the operation logic for correcting the first nonlinear distortion, the solution in this embodiment can greatly reduce correction resources, such as power consumed by the correction circuit and an area occupied by the correction circuit, for the entire radio frequency transceiver. In addition, for the second nonlinear distortion on different channels, the secondary correction circuit may be used to correct respective second nonlinear distortion on each channel. In this way, correction precision and accuracy of the entire radio frequency transmitter can be improved.

The following describes in detail the radio frequency transceiver provided in the embodiments of this application with reference to the accompanying drawings.

Figure 3:
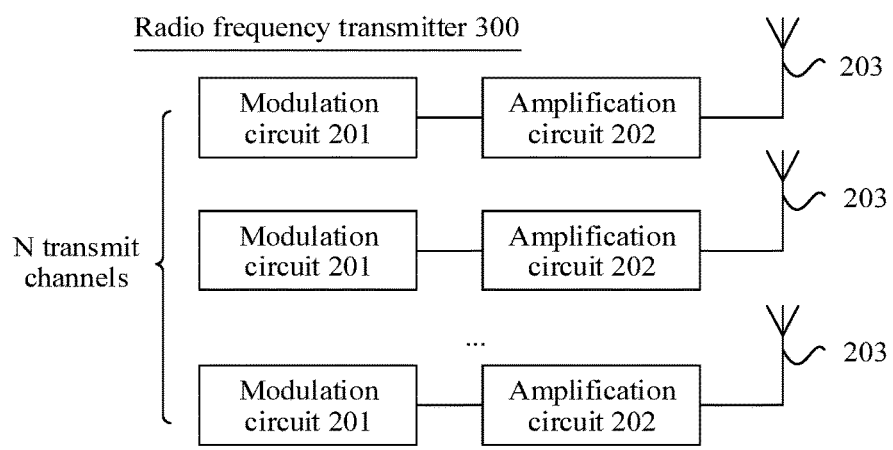
FIG. 3 is a schematic structural diagram 1 of a radio frequency transmitter according to an embodiment of this application.

A radio frequency transmitter is used as an example. As shown in FIG. 3, the radio frequency transmitter 300 includes N (N is a positive integer and N>1) transmit channels. Each transmit channel includes a modulation circuit 201 and an amplification circuit 202 coupled to the modulation circuit 201. Optionally, each transmit channel may further include an antenna 203 coupled to the amplification circuit 202.

The modulation circuit 201 is configured to receive a baseband signal output by a baseband circuit, and modulate the baseband signal into a radio frequency signal. However, in this case, the radio frequency signal output by the modulation circuit 201 has relatively low power, and cannot be converted into an electromagnetic wave by the antenna. In view of this, the modulation circuit 201 inputs the output radio frequency signal to the amplification circuit 202, and the amplification circuit 202 amplifies the power of the radio frequency signal, to obtain an amplified radio frequency signal. Finally, the amplification circuit 202 inputs the amplified radio frequency signal to the antenna 203. The antenna 203 converts the amplified radio frequency signal into an electromagnetic wave and sends the electromagnetic wave to another communications device.

In the radio frequency transmitter 300 shown in FIG. 3, the amplification circuit 202 is a device that is prone to generate nonlinear distortion in the radio frequency transmitter 300. Therefore, the following describes, using an example in which the amplification circuit 202 in each transmit channel is a nonlinear module, a principle of a two-level correction architecture provided in this application.

Figure 4:
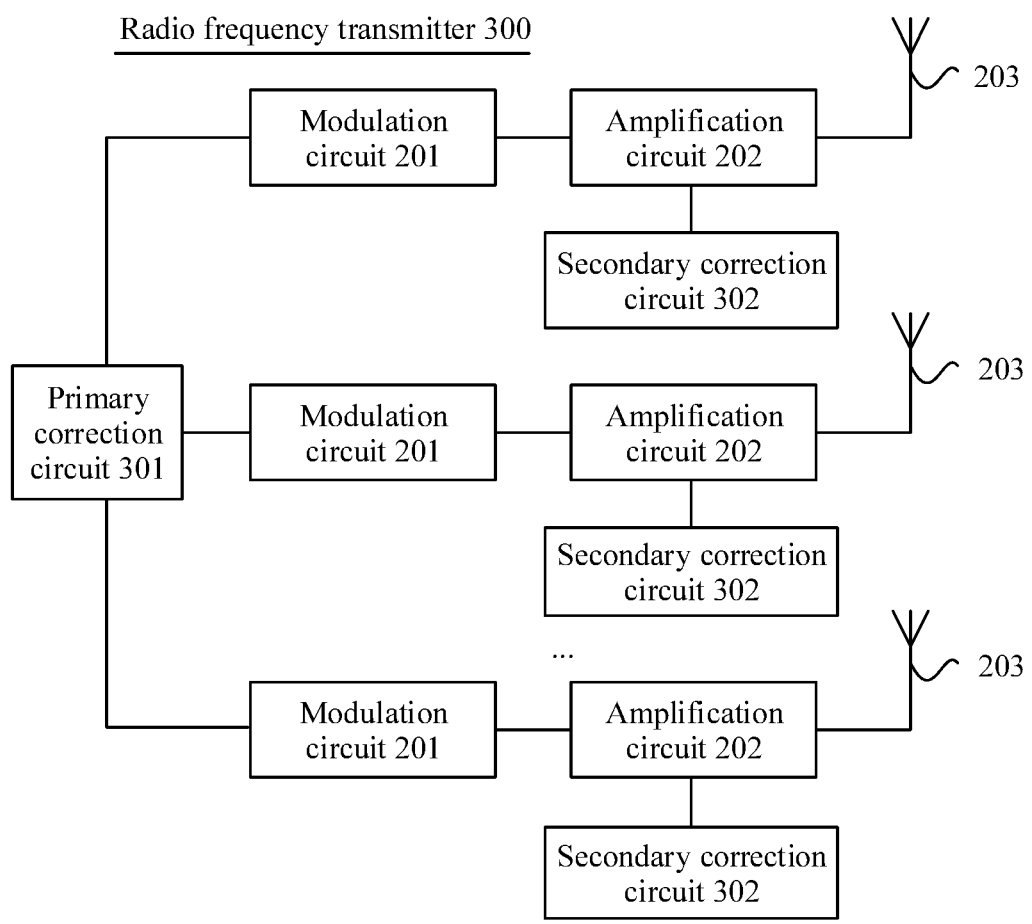
FIG. 4 is a schematic structural diagram 2 of a radio frequency transmitter according to an embodiment of this application.

As shown in FIG. 4, the radio frequency transmitter 300 further includes a primary correction circuit 301 and N secondary correction circuits 302. The N secondary correction circuits 302 are in a one-to-one correspondence with the N transmit channels. In addition, each secondary correction circuit 302 is coupled to an amplification circuit 202 on a corresponding transmit channel, and the primary correction circuit 301 is coupled to the modulation circuit 201 on each of the N transmit channels.

The primary correction circuit 301 is configured to correct first nonlinear distortion that commonly exists in the N amplification circuits 202, and each secondary correction circuit 302 is configured to correct second nonlinear distortion that exists in the amplification circuit 202 corresponding to the secondary correction circuit 302.

In other words, for the first nonlinear distortion that commonly exists in the N amplification circuits 202, for example, nonlinear distortion caused by a temperature variation, the primary correction circuit 301 may be used for correction on each transmit channel. In this way, there is no need to dispose the primary correction circuit 301 on each transmit channel, thereby greatly reducing resources, such as an occupied area and consumed power, for correction of the entire radio frequency transmitter 300.

However, for differentiated second nonlinear distortion that exists in the N amplification circuits 202, for example, different nonlinear distortion caused at different locations on a circuit board, the secondary correction circuit 302 may be used for correction on the corresponding transmit channel. In this way, correction precision and accuracy of the entire radio frequency transmitter 300 can be improved.

For example, the first nonlinear distortion is caused by a first distortion factor, for example, a temperature variation or a batch variation, that is common in the N amplification circuits 202. The second nonlinear distortion is caused by a second distortion factor, for example, a temperature difference at different locations in a working process of the circuit, that varies between the N amplification circuits 202.

Because the nonlinear distortion generated by the radio frequency transmitter 300 is mainly caused by the first distortion factor, the radio frequency transmitter 300 has a relatively high requirement for correcting the first nonlinear distortion caused by the first distortion factor. Therefore, a circuit structure of the primary correction circuit 301 that is used to correct the first nonlinear distortion is usually relatively complex. This causes relatively high power consumption and large area occupation of the primary correction circuit 301. However, in this application, the N transmit channels may share one primary correction circuit 301 to correct the nonlinear distortion, thereby greatly reducing power consumption and area occupation of the radio frequency transmitter 300.

In addition, when the radio frequency transmitter 300 does not require high linearity of an output signal, the foregoing secondary correction circuit 302 may be disabled, and the primary correction circuit 301 corrects nonlinear distortion generated by the N amplification circuits 202. This further reduces power consumption of the radio frequency transmitter 300.

Certainly, the primary correction circuit 301 may alternatively be disabled, and the N secondary correction circuits 302 each correct nonlinear distortion generated by the corresponding amplification circuit 202. In other words, in this embodiment of this application, the primary correction circuit 301 may be configured to be independently enabled or disabled, and the secondary correction circuit 302 may also be configured to be independently enabled or disabled.

Figure 5:
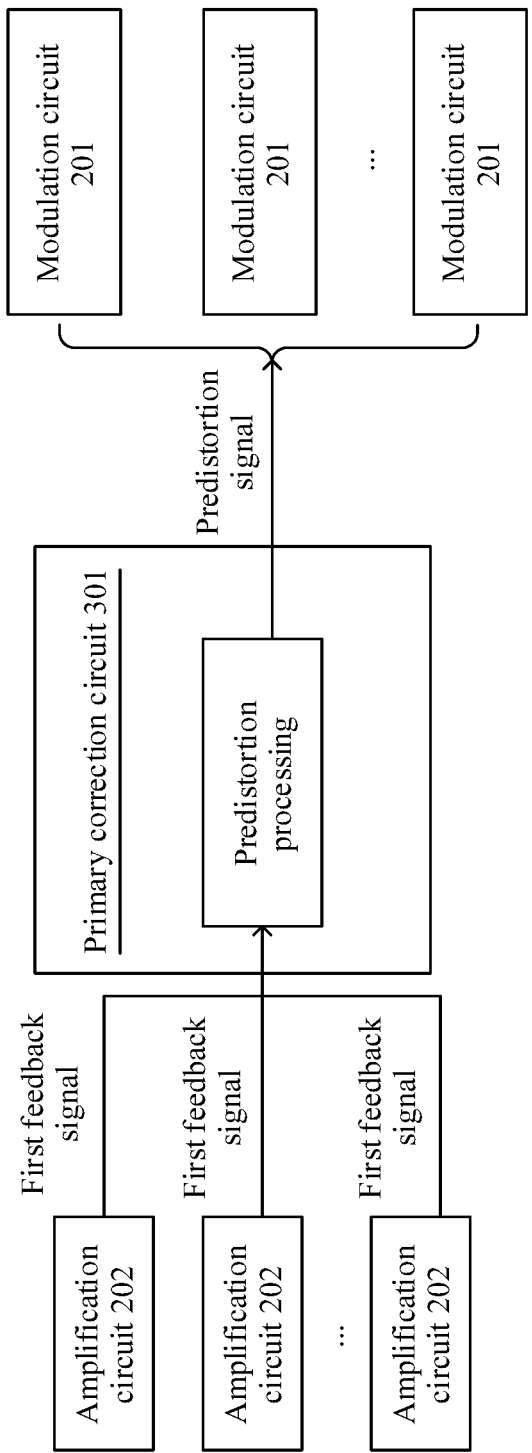
FIG. 5 is a schematic structural diagram 3 of a radio frequency transmitter according to an embodiment of this application.

For example, as shown in FIG. 5, the primary correction circuit 301 may be configured to obtain a first feedback signal from a signal output by each of the N amplification circuits 202 (namely, N nonlinear modules). For example, a coupler may be disposed at an output end of each of the N amplification circuits 202. In this way, after a signal output by each of the N amplification circuits 202 passes through the coupler, a part of the output signal may be used as the first feedback signal and input to the primary correction circuit 301.

Further, still as shown in FIG. 5, the primary correction circuit 301 may perform predistortion processing on N obtained first feedback signals in an APD manner or a DPD correction circuit manner, to predict distortion of an output signal in the radio frequency transmitter 300, and obtain a predistortion signal that can be used to correct the distortion.

In this case, the primary correction circuit 301 may superimpose the predistortion signal as a primary correction signal at an input end of each of the N modulation circuits 201. In this way, subsequently, a distortion signal that actually exists in a transmit signal output by each transmit channel may be cancelled by the predistortion signal, and a transmit signal with higher linearity is obtained.

Figure 6:
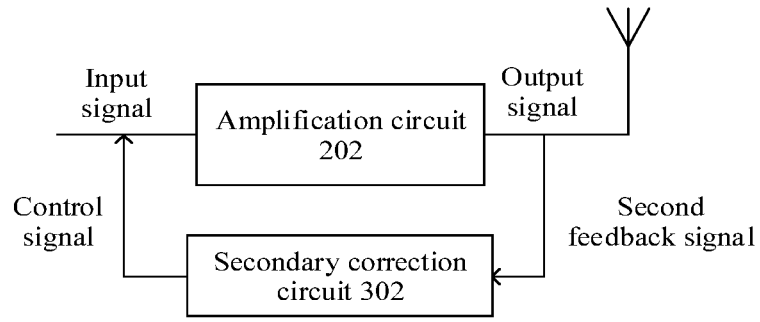
FIG. 6 is a schematic structural diagram 4 of a radio frequency transmitter according to an embodiment of this application.

For example, a transmit channel in the radio frequency transmitter 300 is used as an example. As shown in FIG. 6, an operating principle of the secondary correction circuit 302 is similar to a feedback adjustment principle of the primary correction circuit 301. An input end of the secondary correction circuit 302 is configured to obtain a second feedback signal from a signal output by a corresponding amplification circuit 202 (namely, a nonlinear module). Then, the secondary correction circuit 302 may detect, based on the second feedback signal, a power supply control signal required by the amplification circuit 202 when linearity meets a preset linearity requirement.

The linearity is a percentage of a maximum deviation ($\Delta Y max$) between a correction curve and a fitted line during nonlinear correction to a full-scale output (Y), and may also be referred to as a nonlinear error. A smaller value of the linearity indicates a better linear feature. In this case, that the preset linearity requirement is met may mean that linearity of the nonlinear module is less than or equal to a preset threshold. For example, the preset threshold may be 0 or a relatively small value. When the preset threshold is equal to 0, it indicates that the secondary correction circuit 302 is configured to obtain a power supply control signal that is of the nonlinear module and that exists when a linear feature is optimal.

After the secondary correction circuit 302 outputs the determined power supply control signal to a power supply module in the amplification circuit 202, the power supply module in the amplification circuit 202 may generate a corresponding bias voltage or bias current based on the power supply control signal, and input the bias voltage or the bias current as a power supply signal to a nonlinear device in the amplification circuit 202. In this way, the amplification circuit 202 can obtain an output signal with higher linearity when working at the bias voltage or the bias current.

Figure 7:
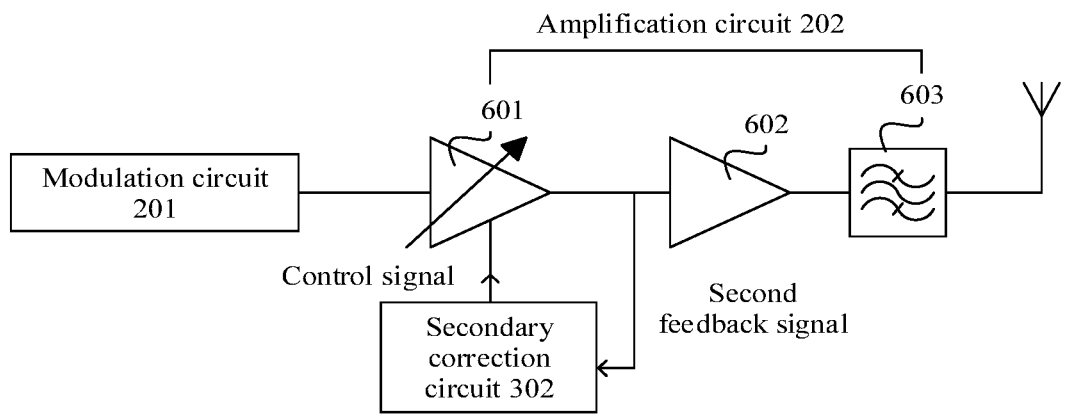
FIG. 7 is a schematic structural diagram 5 of a radio frequency transmitter according to an embodiment of this application.

In a possible design, one transmit channel is still used as an example. As shown in FIG. 7, the amplification circuit 202 may include a VGA 601, a PA 602, and a filter 603. An input end of the VGA 601 is coupled to an output end of a corresponding modulation circuit 201, an output end of the VGA 601 is coupled to an input end of the PA 602, an output end of the PA 602 is coupled to an input end of the filter 603, and an output end of the filter 603 is coupled to a corresponding antenna 203.

Usually, an amplifier device such as the VGA 601 or the PA 602 on the transmit channel is prone to generate odd distortion during working. This causes nonlinear distortion. In view of this, that the VGA 601 is the nonlinear module (the VGA 601 includes a power supply module and a nonlinear device that generates nonlinear distortion) is used as an example, and based on the amplification circuit 202 shown in FIG. 7, an input end of the secondary correction circuit 302 may be coupled to the output end of the VGA 601 and an output end of the secondary correction circuit 302 may be coupled to the power supply module in the VGA 601.

In this case, a signal output by the VGA 601 may be input to the secondary correction circuit 302 as a second feedback signal. The secondary correction circuit 302 may be a feedback loop circuit, and the feedback circuit may continuously adjust the bias voltage or the bias current of the VGA 601 based on the second feedback signal such that the VGA 601 can work at different bias voltages or bias currents. In this way, in a process of continuously adjusting the bias voltage or the bias current of the VGA 601, when it is detected that linearity of the VGA 601 is less than or equal to the preset threshold, the feedback circuit may continuously input, as the power supply control signal, a bias voltage or a bias current at this time to the nonlinear device in the VGA 601 such that the VGA 601 works at a bias voltage or bias current with minimum nonlinear distortion, and corrects second nonlinear distortion generated by the VGA 601.

For example, a signal obtained through each time of sampling from the output signal of the VGA 601 may be input as the second feedback signal to the input end of the secondary correction circuit 302. Further, the secondary correction circuit 302 may perform iteration using an iterative algorithm such as a search algorithm, an shortest path faster algorithm (SPFA) algorithm, or a Newton algorithm based on the second feedback signal. A result of each iteration is the bias voltage or the bias current of the VGA 601. In this case, when an iteration result is converged, it indicates that linearity between the output signal and an input signal of the VGA 601 is the highest at this time. Then, the current iteration result may be input as the power supply control signal of the VGA 601 to the nonlinear device in the VGA 601.

Figure 8:
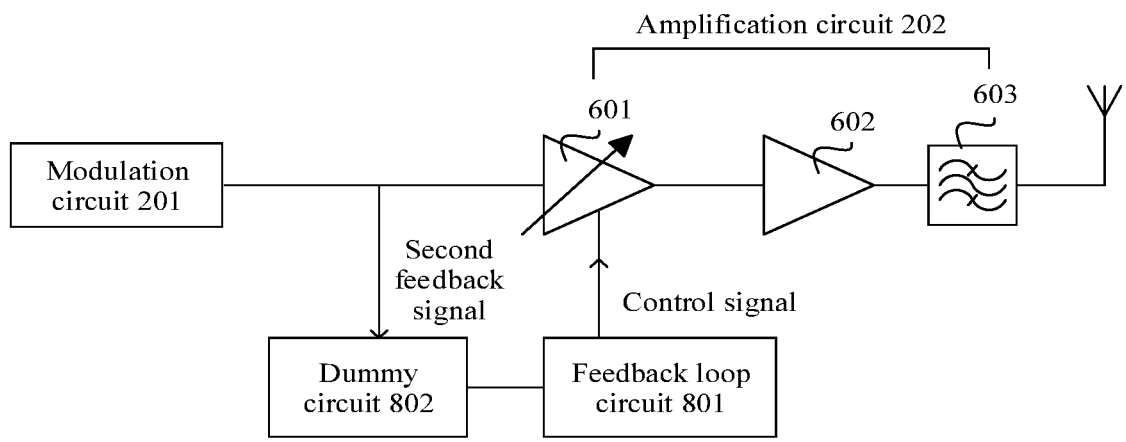
FIG. 8 is a schematic structural diagram 6 of a radio frequency transmitter according to an embodiment of this application.

In another possible design, an example in which the VGA 601 is the nonlinear module is still used. As shown in FIG. 8, the secondary correction circuit 302 may include a feedback circuit 801 and include a dummy circuit 802 of the VGA 601. The dummy circuit 802 may be configured to reproduce a nonlinear feature of the VGA 601. For example, the dummy circuit 802 may be a circuit obtained after the nonlinear device in the VGA 601 is scaled down. Therefore, the dummy circuit 802 can reproduce, to a maximum extent, the nonlinear feature of the VGA 601. In addition, a relatively small size of the dummy circuit 802 contributes to relatively low power consumption. Certainly, when the nonlinear module is another device in the radio frequency transmitter, the dummy circuit 802 may be a circuit obtained after a corresponding nonlinear device is scaled down.

During correction of the nonlinear distortion generated by the nonlinear device in the VGA 601, still as shown in FIG. 8, an input end of the dummy circuit 802 may be coupled to the input end of the VGA 601, an output end of the dummy circuit 802 may be coupled to an input end of the feedback circuit 801, and an output end of the feedback circuit 801 may be coupled to the power supply module in the VGA 601.

In this way, a radio frequency signal that is input by the modulation circuit 201 to the VGA 601 is also input to the dummy circuit 802. Therefore, the nonlinear feature of the nonlinear device in the VGA 601 also appears in the dummy circuit 802. Then, the dummy circuit 802 may input an output signal with nonlinear distortion as the second feedback signal to the feedback circuit 801. The feedback circuit 801 continuously updates a bias voltage or a bias current of the dummy circuit 802 based on the second feedback signal, until linearity of the dummy circuit 802 is less than or equal to the preset threshold. In this case, the feedback circuit 801 may input the bias voltage or the bias current at this time as the power supply control signal to the power supply module in the VGA 601 such that the VGA 601 works at the bias voltage or the bias current, and the linearity between the output signal and the input signal of the VGA 601 reaches an optimized state with minimum nonlinear distortion.

In addition, because the feedback circuit 801 only needs to input a finally obtained optimal power supply control signal to the power supply module in the VGA 601 at a time, the bias voltage or the bias current of the VGA 601 remains unchanged in an entire process of performing nonlinear correction by the feedback circuit 801 and the dummy circuit 802. This can reduce impact of the correction process on a main channel signal.

Certainly, a two-level correction architecture including the primary correction circuit 301 and the secondary correction circuit 302 may be used to a correct a device that generates nonlinear distortion, for example, the modulation circuit or the PA in the radio frequency transmitter 300. For another example, the two-level correction architecture including the primary correction circuit 301 and the secondary correction circuit 302 may be used to correct a plurality of devices (for example, the VGA and the PA) as a whole in the radio frequency transmitter 300. This is not limited in this embodiment of this application.

In other embodiments of this application, the primary correction circuit may alternatively not be disposed in the radio frequency transmitter. In an embodiment, the radio frequency transmitter includes only N (N is a positive integer greater than 1) transmit channels and N correction circuits.

Each transmit channel includes one nonlinear module.

In addition, the N correction circuits may be in a one-to-one correspondence with the N transmit channels, and each correction circuit includes a feedback circuit and a dummy circuit. Similar to FIG. 8, the dummy circuit may be used to reproduce a nonlinear feature of a corresponding nonlinear module. For example, the dummy circuit may be a circuit obtained after a nonlinear module (for example, a VGA) on a transmit channel corresponding to the dummy circuit is scaled down. In this case, the nonlinear feature of the nonlinear module also appears in the dummy circuit.

Specifically, an input end of the dummy circuit on each transmit channel is coupled to an input end of the nonlinear module, an output end of the dummy circuit is coupled to an input end of the feedback circuit, and an output end of the feedback circuit is coupled to a power supply module in the nonlinear module.

Then, the dummy circuit may input an output signal with nonlinear distortion as a feedback signal to the feedback circuit. The feedback circuit may continuously update a bias voltage or a bias current of a power supply control signal of the dummy circuit based on the feedback signal, until linearity between an output signal and an input signal of the dummy circuit meets a preset requirement (for example, highest linearity). In this case, the feedback circuit may input the bias voltage or the bias current at this time as the power supply control signal to the power supply module in the nonlinear module such that a nonlinear device in the nonlinear module can work at the bias voltage or the bias current, and the linearity between an output signal and an input signal of the nonlinear module reaches an optimized state with minimum nonlinear distortion.

Figure 9:
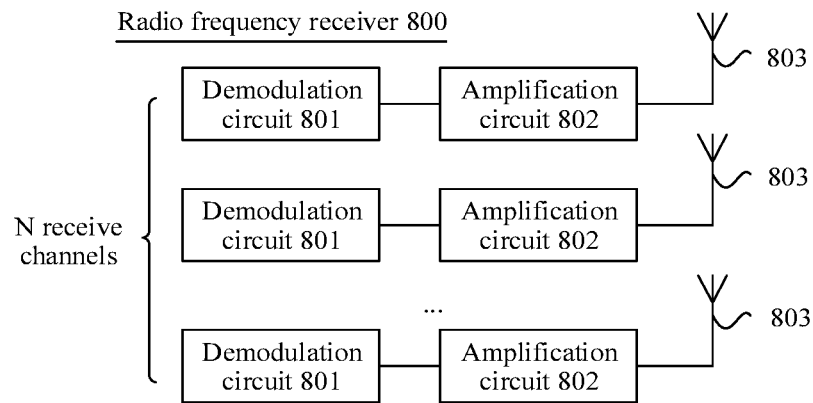
FIG. 9 is a schematic structural diagram 1 of a radio frequency receiver according to an embodiment of this application.

In addition, an embodiment of this application further provides a radio frequency receiver. As shown in FIG. 9, the radio frequency receiver 800 includes N (N>1) receive channels, and each receive channel includes a demodulation circuit 801 and an amplification circuit 802 coupled to the demodulation circuit 801. Optionally, each receive channel may further include an antenna 803 coupled to the amplification circuit 802.

The antenna 803 receives a signal sent by another communications device in a form of an electromagnetic wave, and the amplification circuit 802 may filter and amplify the received signal. Then, the demodulation circuit 801 demodulates a radio frequency signal at a relatively high frequency into an intermediate frequency (IF) signal or a baseband signal at a relatively low frequency. In this way, a baseband processor may subsequently read valid information in the baseband signal output by the demodulation circuit 801, or a down-conversion circuit performs down-conversion sampling on the IF signal output by the demodulation circuit 801, to obtain a baseband signal that can be processed by a baseband processor.

Based on the radio frequency receiver 800 shown in FIG. 9, a device that is prone to generate nonlinear distortion in the radio frequency receiver 800 is mainly the demodulation circuit 801. Therefore, the following uses an example in which the demodulation circuit 801 on each transmit channel is a to-be-corrected nonlinear module, to describe a principle of a two-level correction architecture provided in this application.

Figure 10:
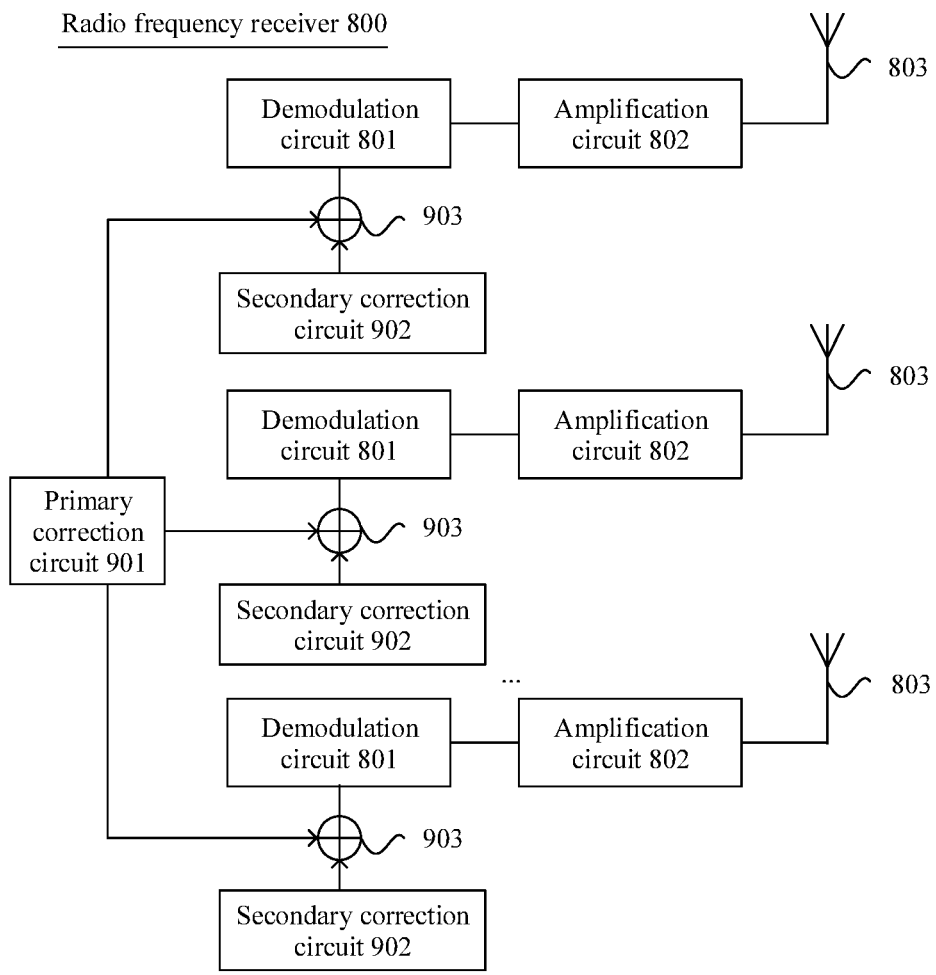
FIG. 10 is a schematic structural diagram 2 of a radio frequency receiver according to an embodiment of this application.

As shown in FIG. 10, the radio frequency receiver 800 further includes a primary correction circuit 901 and N secondary correction circuits 902. The N secondary correction circuits 902 are in a one-to-one correspondence with the N receive channels, and each secondary correction circuit 902 is coupled to a demodulation circuit 801 on a corresponding receive channel. The primary correction circuit 901 is coupled to each demodulation circuit 801 on the N receive channels. For example, as shown in FIG. 10, each secondary correction circuit 902 is coupled to the demodulation circuit 801 on the corresponding receive channel through an adder 903, and the primary correction circuit 901 is also coupled to each demodulation circuit 801 on the N receive channels through the adder 903.

Because the demodulation circuit 801 in the radio frequency receiver 800 is prone to generate an even harmonic during working. This causes nonlinear distortion. Therefore, similar to the foregoing radio frequency transmitter 300, the primary correction circuit 901 in the radio frequency receiver 800 is configured to correct first nonlinear distortion that commonly exists in the N demodulation circuits 801 (namely, N nonlinear modules). Each secondary correction circuit 902 needs to correct only second nonlinear distortion that exists in the demodulation circuit 802 coupled to the secondary correction circuit 902. For the first nonlinear distortion and the second nonlinear distortion, refer to the descriptions in the foregoing embodiment. Details are not described herein again.

In other words, for the first nonlinear distortion that commonly exists in the N demodulation circuits 801, the primary correction circuit 901 may be used for correction on all the receive channels. In this way, there is no need to dispose the primary correction circuit 801 on each receive channel, thereby greatly reducing resources consumed during correction of the entire radio frequency receiver 800.

However, for differentiated second nonlinear distortion that exists in the N demodulation circuits 801, the secondary correction circuit 902 may be used to correct the demodulation circuit 801 on the transmit channel. In this way, correction precision and accuracy of the entire radio frequency receiver 800 can be improved.

Figure 11:
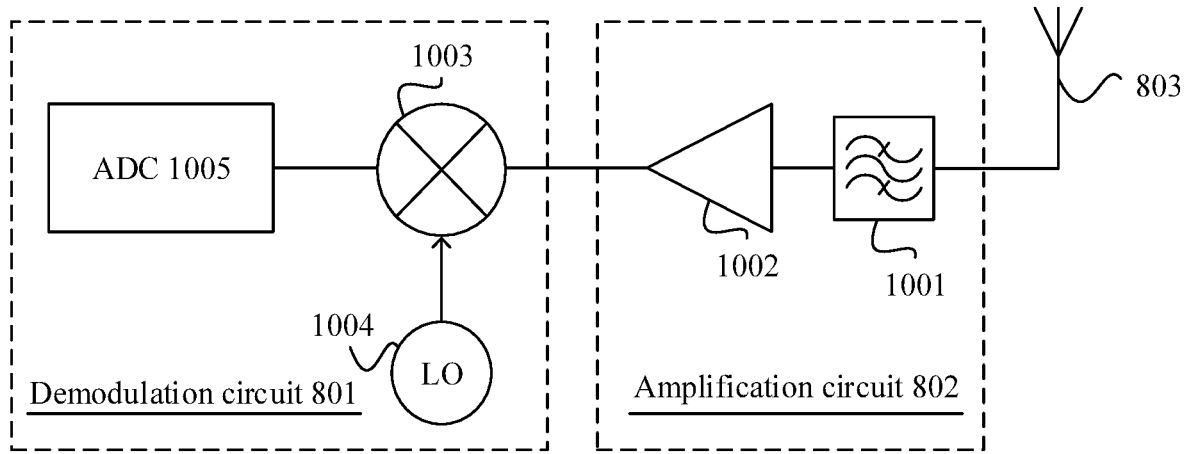
FIG. 11 is a schematic structural diagram 3 of a radio frequency receiver according to an embodiment of this application.

For example, one receive channel is used as an example. As shown in FIG. 11, the amplification circuit 802 may further include a filter 1001 and low-noise amplifier (LNA) 1002. The demodulation circuit 801 may further include a mixer 1003, a local oscillator (LO) 1004, an analog-to-digital converter (ADC) 1005, and the like. An input end of the filter 1001 is coupled to the antenna 803, an output end of the filter 1001 is coupled to an input end of the LNA 1002, an output end of the LNA 1002 is coupled to a first input end of the mixer 1003, a second input end of the mixer 1003 is coupled to the LO 1004, and an output end of the mixer 1003 is coupled to the ADC 1005. It should be noted that a plurality of receive channels may reuse a same LO 1004. Certainly, the plurality of receive channels may also reuse another device other than the LO 1004. This is not limited in this embodiment of this application.

A radio frequency signal received by the antenna 803 is filtered by the filter 1001 and amplified by the LNA 1002, and is then input, with an LO signal generated by the LO 1004, to the mixer 1003 for down-conversion in order to convert the radio frequency signal into an IF signal. The IF signal is down-converted the second time to obtain a fundamental frequency signal, and the fundamental frequency signal is further converted into a baseband signal after being input into the ADC 1005. Certainly, if the radio frequency receiver uses a zero-intermediate-frequency architecture, the mixer 1003 may directly down-convert the radio frequency signal into a fundamental frequency signal. In addition, there are architectures such as a low-intermediate-frequency architecture and a superheterodyne architecture, and the architectures may also be applied to the radio frequency receiver in this embodiment. For details, reference may be made to other approaches.

However, the mixer 1003 is prone to generate an even harmonic during working. This causes nonlinear distortion in the radio frequency receiver 800. In this case, the mixer 1003 may be used as the nonlinear module (the mixer 1003 includes a power supply module and a nonlinear device that generates nonlinear distortion), and the nonlinear distortion generated by the mixer 1003 is corrected by adjusting a bias voltage of the power supply module in the mixer 1003.

Figure 12:
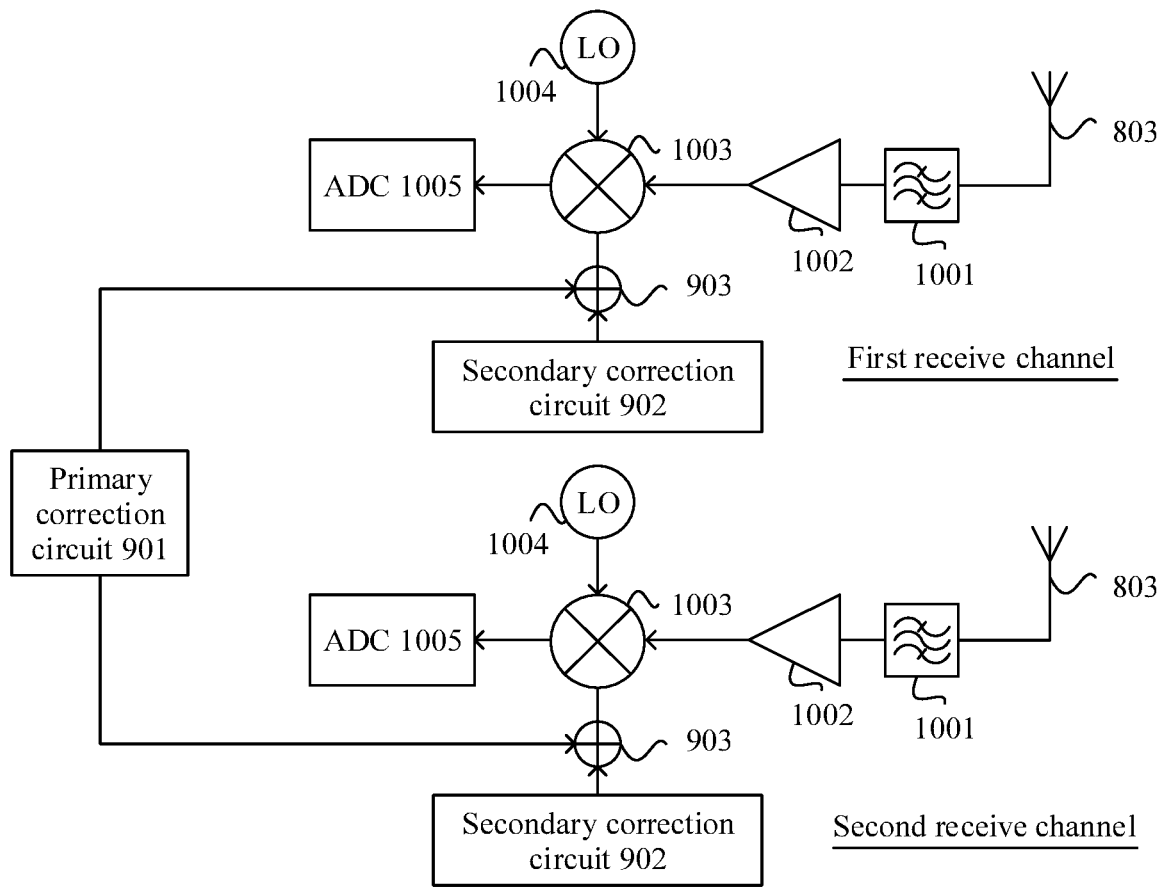
FIG. 12 is a schematic structural diagram 4 of a radio frequency receiver according to an embodiment of this application.

Based on the radio frequency receiver 800 shown in FIG. 11, as shown in FIG. 12, a bias voltage of each mixer 1003 may be jointly adjusted by the primary correction circuit 901 and a secondary correction circuit 902 on a corresponding receive channel. The bias voltage of the mixer 1003 may be provided by an output end of the adder 903. A first input end of the adder 903 is an output end of the primary correction circuit 901, and a second input end of the adder 903 is an output end of the secondary correction circuit 902 coupled to the mixer 1003.

For example, the bias voltage of the mixer 1003 includes M (M>1) bits. The primary correction circuit 901 may be configured to correct the first X bits of the bias voltage of the mixer 1003, and the secondary correction circuit 902 is configured to correct the last Y bits of the bias voltage of the mixer 1003, where X+Y=M.

For example, as shown in FIG. 12, it is assumed that a bias voltage of a mixer 1003 on a first receive channel needs to be adjusted to 0.91 volts (V) to remove nonlinear distortion on the channel, and a bias voltage of a mixer 1003 on a second receive channel needs to be adjusted to 0.88 V to remove nonlinear distortion on the channel. A 0.9 V bias voltage is set for first nonlinear distortion that commonly exists on all receive channels, and a 0.01 V increased bias voltage on the first receive channel and a 0.02 V decreased bias voltage on the second receive channel are adjusted for respective second nonlinear distortion on each receive channel.

In this case, the primary correction circuit 901 may output a first voltage of 0.9 V, and correct the first digit after the decimal point of a value of the bias voltage. Then, the secondary correction circuit 902 on the first receive channel outputs a second voltage of 0.1 V, and correct the second digit after the decimal point of the value of the bias voltage. In this way, after the first voltage of 0.9 V output by the primary correction circuit 901 and the second voltage of 0.1 V output by the secondary correction circuit 902 are added by the adder 903, a corrected bias voltage of 0.91 V may be output to the mixer 1003 on the first receive channel.

Similarly, the secondary correction circuit 902 on the second receive channel may output a second voltage of 0.2 V. After the first voltage of 0.9 V output by the primary correction circuit 901 and the second voltage of 0.2 V output by the secondary correction circuit 902 are added by the adder 903, a corrected bias voltage of 0.88 V may be output to the mixer 1003 on the second receive channel.

In other words, for the first nonlinear distortion that commonly exist in the N mixers 1003, the primary correction circuit 901 may be used for correction on all the receive channels in a large dynamic coarse calibration manner. For differentiated second nonlinear distortion that exists in the N mixers 1003, the secondary correction circuits 902 on the corresponding receive channels may be used for correction on the receive channels in a small dynamic fine calibration manner.

In addition, when the radio frequency receiver 800 does not require high correction accuracy of a received signal, for example, require bias voltages of the mixers 1003 on the first receive channel and the second receive channel to be accurate to one decimal place, the bias voltages of the mixer 1003 on both the first receive channel and the second receive channel are 0.9 V. In this case, the N secondary correction circuits 902 may be disabled, and the primary correction circuit 901 is used for correction on each receive channel. This further reduces power consumption of the radio frequency receiver 800.

In some embodiments of this application, during design of a specific circuit structure of the radio frequency receiver 800, nonlinear distortion generated by the nonlinear module (for example, the foregoing mixer 1003) on each receive channel may be simulated, to obtain a rough distortion range of the nonlinear distortion generated by the mixer 1003 in the entire radio frequency receiver 800. For example, a distortion range of the bias voltage of the mixer 1003 is between 0.8 V and 1.2 V.

In this case, during actual working of the radio frequency receiver 800, after the ADC 1005 on each receive channel converts the fundamental frequency (or IF) signal output by the mixer 1003 into the baseband signal, it may be determined whether the mixer 1003 generates nonlinear distortion. If nonlinear distortion is generated, the ADC 1005 may indicate the primary correction circuit 901 to perform nonlinear correction. In this case, the primary correction circuit 901 may continuously adjust the bias voltage of the mixer 1003 on each receive channel within the distortion range between 0.8 V and 1.2 V, until linearity of the mixer 1003 on each receive channel meets a preset requirement (for example, the linearity is less than 1). When the linearity of the mixer 1003 on each receive channel meets the preset requirement, it indicates that the first nonlinear distortion generated by the mixer 1003 on each receive channel is corrected by the primary correction circuit 901. To correct the differentiated second nonlinear distortion that exists in the mixers 1003 on different receive channels, the secondary correction circuit 902 on each receive channel may continuously adjust the bias voltage, of the mixer 1003, output by the primary correction circuit 901, until the linearity of the mixer 1003 on each receive channel reaches an optimal state (for example, the linearity is less than 0.2).

For example, the primary correction circuit may be further a DAC, for example, a first DAC. The secondary correction circuit may also be a DAC, for example, a second DAC. This is not limited in this embodiment of this application.

Certainly, a two-level correction architecture including the primary correction circuit 301 and the secondary correction circuit 302 may be used to a correct a device that generates nonlinear distortion, for example, the amplification circuit or the LNA in the radio frequency receiver 800. For another example, the two-level correction architecture including the primary correction circuit 301 and the secondary correction circuit 302 may be used to correct a plurality of devices as a whole in the radio frequency receiver 800. This is not limited in this embodiment of this application.

It should be noted that the radio frequency receiver 800 shown in FIG. 4 to FIG. 12 may reuse related devices such as an antenna and a filter in the radio frequency transmitter 300 shown in FIG. 3 to FIG. 8. In other words, the radio frequency receiver 800 and the radio frequency transmitter 300 may share a same antenna and filter.

An embodiment of this application further provides a radio frequency transceiver chip. The chip may integrate the radio frequency transmitter 300 shown in FIG. 3 to FIG. 8 and the radio frequency receiver 800 shown in FIG. 4 to FIG. 12.

Further, an embodiment of this application further provides a communications device including the foregoing radio frequency transceiver chip. The communications device may be applied to any device that needs to send and receive a radio frequency signal. For example, the device may be a mobile phone, a tablet computer, a wearable device, a vehicle-mounted device, augmented reality (AR)/virtual reality (VR) device, a notebook computer, an ultra-mobile personal computer (UMPC), a netbook, a personal digital assistant (PDA), a base station, a switch, a router, or the like. This is not limited in this embodiment of this application.

In a possible design, the communications device further includes a baseband processor and the radio frequency transmitter 300 shown in FIG. 4 to FIG. 8. The radio frequency transmitter 300 is coupled to the baseband processor. The radio frequency transmitter 300 is configured to convert a baseband signal output by the baseband processor into a radio frequency signal, and output the radio frequency signal through an antenna.

For example, as shown in FIG. 4, the radio frequency transmitter 300 includes N transmit channels, and each transmit channel includes a modulation circuit 201 and an amplification circuit 202 coupled to the modulation circuit 201. An input end of the modulation circuit 201 on each transmit channel may be used as an input end of the radio frequency transmitter 300, and the input end of the radio frequency transmitter 300 is coupled to an output end of the baseband processor. In addition, an output end of the amplification circuit 202 on each transmit channel may be used as an output end of the radio frequency transmitter 300, and the output end of the radio frequency transmitter 300 is coupled to an input end of the antenna.

In another possible design, the communications device further includes a baseband processor and the radio frequency receiver 800 shown in FIG. 10 to FIG. 12. The radio frequency receiver 800 is coupled to the baseband processor. The radio frequency receiver 800 is configured to convert a radio frequency signal received by an antenna into a baseband signal, and input the baseband signal to the baseband processor.

For example, as shown in FIG. 10, the radio frequency receiver 800 includes N receive channels, and each receive channel includes a modulation circuit 201 and an amplification circuit 202 coupled to the modulation circuit 201. An input end of the amplification circuit 202 on each receive channel may be used as an input end of the radio frequency receiver 800, and the input end of the radio frequency receiver 800 is coupled to an output end of the baseband antenna. In addition, an output end of the modulation circuit 201 on each receive channel may be used as an output end of the radio frequency receiver 800, and the output end of the radio frequency receiver 800 is coupled to an input end of the baseband processor.

It may be understood that, to implement the foregoing functions, the foregoing terminal or the like includes corresponding hardware structures and/or software modules for performing the functions. A person skilled in the art should easily be aware that, in combination with the examples described in the embodiments disclosed in this specification, units and algorithm steps may be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of the embodiments of this application.

All or some of the foregoing embodiments may be implemented using software, hardware, firmware, or any combination thereof. When a software program is used to implement the embodiments, the embodiments may be implemented completely or partially in a form of a computer program product. The computer program product includes one or more computer instructions. When the computer program instructions are loaded and executed on a computer, the procedure or functions according to the embodiments of this application are all or partially generated. The computer may be a general-purpose computer, a special-purpose computer, a computer network, or another programmable apparatus. The computer instructions may be stored in a computer readable storage medium or may be transmitted from a computer readable storage medium to another computer readable storage medium. For example, the computer instructions may be transmitted from a web site, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a solid-state drive (SSD)), or the like.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A radio frequency transmitter comprising:
N transmit channels, wherein each transmit channel comprises a nonlinear device, and wherein N is a positive integer greater than 1;
a primary correction circuit coupled to each nonlinear device of the N transmit channels and configured to provide a common primary correction signal for each nonlinear device of the N transmit channels, wherein the primary correction signal corrects a nonlinear distortion for each nonlinear device of the N transmit channels; and
N secondary correction circuits each coupled to a respective nonlinear device of the N transmit channels, and wherein each of the N secondary correction circuits comprises;
a dummy circuit, wherein the dummy circuit is a scaled down circuit of the respective nonlinear device of the N transmit channels; and
a feedback circuit coupled to the dummy circuit and configured to:
detect a bias voltage or a bias current of the dummy circuit;
update the bias voltage or the bias current of the dummy circuit based on a feedback signal received from the dummy circuit to obtain an updated bias voltage or bias current; and provide the updated bias voltage or the bias current to the respective nonlinear device of the N transmit channels as a secondary correction signal, wherein the nonlinear device of the N transmit channels operates at the bias voltage or the bias current.

2. The radio frequency transmitter of claim 1, wherein the primary correction circuit is configured to:
obtain a plurality of feedback signals from the nonlinear systems;
generate a predistortion signal based on the feedback signals; and
input the predistortion signal to the power supply system, wherein the predistortion signal is the primary correction signal.

3. The radio frequency transmitter of claim 1, wherein each of the N secondary correction circuits is configured to:
obtain a feedback signal from each nonlinear device;
obtain a power supply control signal from each nonlinear device based on the feedback signal when the power supply control signal exists in response to linearity of the dummy circuit, wherein the power supply control signal is the secondary correction signal.

4. The radio frequency transmitter of claim 1, wherein a first type of nonlinear distortion is in response to a common first distortion factor, wherein a second type of nonlinear distortion is in response to a differentiated second distortion factor, and wherein the first distortion factor comprises temperature variation, and the second distortion factor comprises random process mismatch at different locations.

5. The radio frequency transmitter of claim 1, wherein each of the N secondary correction circuits comprises:
the feedback circuit comprising:
a first input end; and
a second output end coupled to a power supply system, wherein the dummy circuit is configured to reproduce a nonlinear feature of the nonlinear device, wherein the dummy circuit comprises:
a second input end coupled to the nonlinear device; and
a second output end coupled to the first input end.

6. The radio frequency transmitter of claim 1, wherein the primary correction circuit is a first digital to analog converter (DAC), wherein the second correction circuit is a second DAC.

7. The radio frequency transmitter of claim 1, wherein the primary correction circuit is configured to be independently enabled or disabled, and wherein the secondary correction circuit is configured to be independently enabled or disabled.

8. A radio frequency receiver, comprising:
N receive channels, wherein each receive channel comprises a nonlinear device, and wherein N is a positive integer greater than 1;
one primary correction circuit in a one-to-N correspondence to the nonlinear device in each receive channel, commonly shared by the N nonlinear device, wherein the primary correction circuit is coupled to each nonlinear device of the N receive channels and configured to provide a commonly shared primary correction signal, for each nonlinear device of each N receive channels; and
N secondary correction circuits in a one-to-one correspondence to the nonlinear device in each receive channel, wherein each of the secondary correction circuits is coupled to each nonlinear device of the N receive channels respectively,
wherein each of the secondary correction circuits is configured to provide a secondary correction signal for each nonlinear device respectively, and
wherein the secondary correction signal corrects a nonlinear distortion of nonlinear device respectively.

9. The radio frequency receiver of claim 8, wherein each of the N receive channels comprises:
a power supply system coupled to the nonlinear device and configured to adjust a power supply to the nonlinear device based on correction signals comprising the primary correction signal and the secondary correction signal.

10. The radio frequency receiver of claim 9, wherein the power supply system comprises a bias voltage of multiple bits, wherein the primary correction circuit is configured to correct a first X bits of the multiple bits, and wherein the secondary correction circuits are configured to correct a last Y bits of the multiple bits, and wherein X, Y are integers.

11. The radio frequency receiver of claim 8, wherein each receiver further comprises an adder, wherein, in each receiver, each of the secondary correction circuits is coupled to nonlinear device by the adder, and wherein the primary correction circuit is coupled to each nonlinear device through the adder of each receiver.

12. The radio frequency receiver of claim 8, wherein the nonlinear distortion corrected by the primary correction circuit is in response to a common first distortion factor, and wherein the nonlinear distortion is corrected by the secondary correction circuit in response to a differentiated second distortion factor.

13. The radio frequency receiver of claim 8, wherein each of the secondary correction circuits comprises a dummy circuit, wherein each dummy circuit is a scaled down circuit of each nonlinear device respectively, and wherein the secondary correction signal is produced based on the dummy circuit for each secondary correction circuit.

14. A communication device, comprising:
an antenna;
a baseband processor coupled to the antenna; and
a radio frequency receiver coupled to the baseband processor and the antenna and comprising:
N receive channels, wherein each receive channel comprises a nonlinear device, and wherein N is a positive integer greater than 1;
one primary correction circuit coupled to each nonlinear device of the N receive channels and configured to provide a primary correction signal to each nonlinear device of the N receive channels; and
N secondary correction circuits,
wherein each of the secondary correction circuits is coupled to each nonlinear device of the N receive channels respectively,
wherein each of the secondary correction circuits is configured to provide a secondary correction signal for each nonlinear device respectively,
wherein the first primary correction signal is configured to adjust the first part of commonly shared power supply for the N nonlinear device in a one-to-N correspondence, and
wherein the second correction signal is configured to adjust the second part of differentiated power supply for the N nonlinear device in one-to-one correspondence.

15. The communication device of claim 14, wherein each of the N receive channels comprises:
a power supply system coupled to the nonlinear device and configured to adjust a power supply to the nonlinear device based on correction signals comprising the primary correction signal and the secondary correction signal.

16. The communication device of claim 15, wherein the power supply system comprises a bias voltage of multiple bits, wherein the primary correction circuit is configured to correct a first X bits of the multiple bits, and wherein the secondary correction circuits are configured to correct a last Y bits of the multiple bits, and wherein X, Y are integers.

17. The communication device of claim 15, wherein each receiver further comprises an adder, wherein, in each receiver, each of the secondary correction circuits is coupled to nonlinear device by the adder, and wherein the primary correction circuit is coupled to each nonlinear device through the adder of each receiver.

18. The communication device of claim 15, wherein the nonlinear distortion corrected by the primary correction circuit is in response to a common first distortion factor, and wherein the nonlinear distortion is corrected by the secondary correction circuit in response to a differentiated second distortion factor.

19. The communication device of claim 15, wherein each of the secondary correction circuits comprises a dummy circuit, wherein each dummy circuit is a scaled down circuit of each nonlinear device respectively, and wherein the secondary correction signal is produced based on the dummy circuit for each secondary correction circuit.

* * * * *